United States Patent
Rostem et al.

(10) Patent No.: US 11,313,729 B1
(45) Date of Patent: Apr. 26, 2022

(54) PHONONIC-ISOLATED KINETIC INDUCTANCE DETECTOR AND FABRICATION METHOD THEREOF

(71) Applicant: United States of America as represented by the Administrator of NASA, Washington, DC (US)

(72) Inventors: Karwan Rostem, Baltimore, MD (US); Edward Wollack, Greenbelt, MD (US); Peter deVisser, Utrecht (NL)

(73) Assignee: United States of America as represented by the Administrator of NASA, Washington, DC (US)

( * ) Notice: Subject to any disclaimer, the term of this patent is extended or adjusted under 35 U.S.C. 154(b) by 445 days.

(21) Appl. No.: 16/585,559

(22) Filed: Sep. 27, 2019

Related U.S. Application Data

(60) Provisional application No. 62/834,572, filed on Apr. 16, 2019.

(51) Int. Cl.
*G01J 5/08* (2022.01)
*G01J 5/22* (2006.01)
*H01L 39/24* (2006.01)
*H01L 39/14* (2006.01)
*H01L 39/12* (2006.01)

(52) U.S. Cl.
CPC .............. *G01J 5/0853* (2013.01); *G01J 5/22* (2013.01); *H01L 39/12* (2013.01); *H01L 39/14* (2013.01); *H01L 39/249* (2013.01)

(58) Field of Classification Search
CPC G01J 5/0853; G01J 5/22; H01L 39/12; H01L 39/14; H01L 39/249
See application file for complete search history.

(56) References Cited

U.S. PATENT DOCUMENTS 10,989,604 B1 * 4/2021 Denis ....................... G01J 5/20

* cited by examiner

*Primary Examiner* — David P Porta
*Assistant Examiner* — Meenakshi S Sahu
(74) *Attorney, Agent, or Firm* — Heather Goo; Bryan A. Geurts; Helen M. Galus

(57) ABSTRACT

The present invention relates to a phononic-isolated Kinetic Inductance Detector (KID) and a method of fabrication thereof. The KID is a highly sensitive superconducting cryogenic detector which can be scaled to very large format arrays. The fabrication process of the KID of the present invention integrates a phononic crystal into a KID architecture. The phononic structures are designed to reduce the loss of recombination and athermal phonons, resulting in lower noise and higher sensitivity detectors.

22 Claims, 1 Drawing Sheet

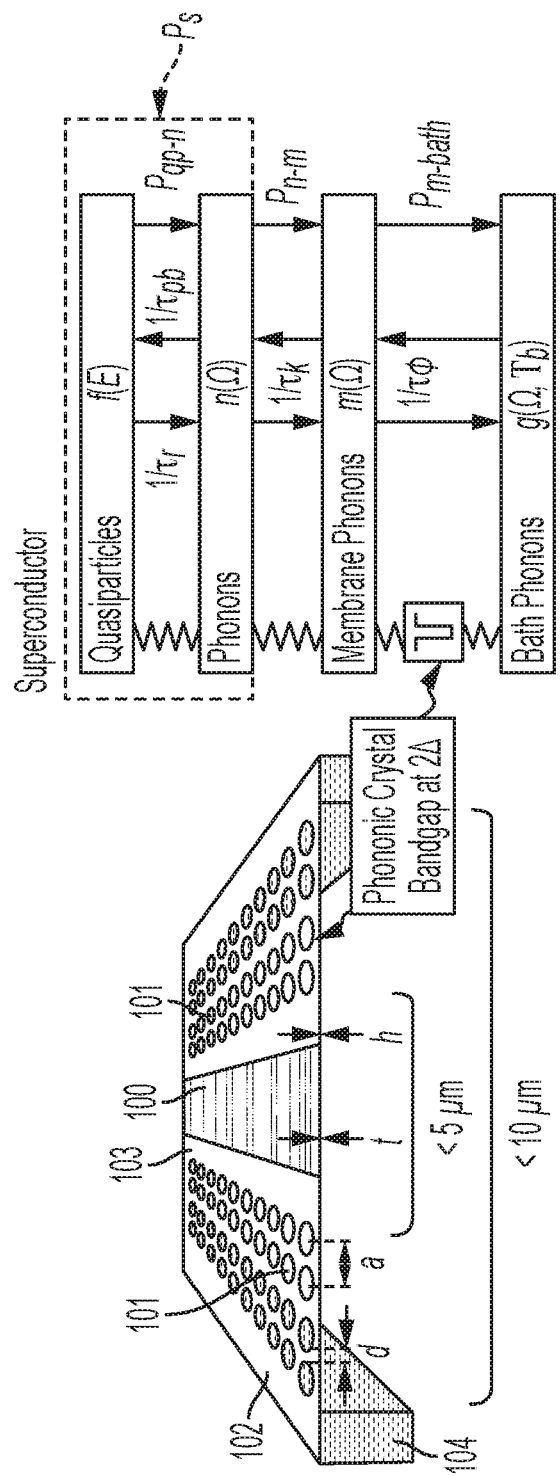

PHONONIC-ISOLATED KINETIC INDUCTANCE DETECTOR AND FABRICATION METHOD THEREOF

CROSS-REFERENCE TO RELATED APPLICATIONS

The present application claims priority from U.S. Provisional Patent Application No. 62/834,572, filed Apr. 16, 2019, the contents of which are herein incorporated by reference in their entirety. The present invention is related to co-pending U.S. Patent Application entitled "Phononic Devices and Methods of Fabrication Thereof", filed Sep. 27, 2019, U.S. patent application Ser. No. 16/585,496, and co-pending U.S. Patent Application entitled "Cryogenic Detector with Integrated Backshort and Method of Manufacturing Thereof", filed Sep. 27, 2019, U.S. patent application Ser. No. 16/585,509, the contents of which are herein incorporated by reference in their entirety.

ORIGIN OF THE INVENTION

The invention described herein was at least in-part made by an employee of the United States Government and may be manufactured or used by or for the Government of the United States of America for governmental purposes without the payment of any royalties thereon or therefor.

BACKGROUND OF THE INVENTION

1. Field of the Invention

The present invention relates to a phononic-isolated Kinetic Inductance Detector (KID) and a fabrication method thereof. The KID is a highly sensitive superconducting cryogenic detector which can be scaled to very large format arrays. The fabrication process of the KID of the present invention integrates a phononic crystal into a KID architecture. The phononic structures are designed to reduce the loss of recombination and athermal phonons in the sensor's superconducting thin film resulting in lower noise and higher sensitivity detectors.

2. Description of the Related Art

Kinetic inductance detectors (KIDs) are highly scalable to large format but have not been demonstrated with noise equivalent power (NEP) less than $10^{-19}$ W/rt-Hz and are limited by the generation-recombination of quasi-particles in the superconducting film.

Thus, a KID which can be isolated and where the quasiparticle lifetime can be increased, thereby reducing the noise equivalent power (NEP) without sacrificing the scalability, is desired.

SUMMARY OF THE INVENTION

The present invention relates to a phononic-isolated Kinetic Inductance Detector (KID) and a method of fabrication thereof. The KID is a highly sensitive superconducting cryogenic detector which can be scaled to very large format arrays. The fabrication process of the KID of the present invention integrates a phononic crystal into a KID architecture. The phononic structures are designed to reduce the loss of recombination and athermal phonons from the superconductor, resulting in lower noise and higher sensitivity detectors.

It is anticipated that a photon noise limited sub-mm/far-infrared (IR) cold telescope in space will require detectors with noise equivalent power (NEP) less than $1\times10^{-19}$ W/Hz$^{1/2}$ for imaging applications and at least an order of magnitude lower for spectroscopic studies. The detector NEP can be reduced by lowering the operational temperature and improving the thermal isolation between the bolometer and a heat bath. The present invention achieved this by fabricating a membrane isolated transition edge sensor (TES) bolometer incorporating compact (<50 µm) thermal isolation beams based on phononic filters.

Since phonons can propagate coherently through a solid medium, such as a dielectric membrane or beam, at temperatures below ~200 mK, the inventors of the present invention utilized this attribute to design structures such that there is a phononic bandgap that blocks modes of heat flow through the beams.

In the present invention, multistage filters are incorporated with tuned bandgaps that are analogous to poles in an electronic filter. A stop-band provides high rejection of heat flow in a compact geometry.

In the present invention, a variety of phononic device geometries have been fabricated including two dimensional (2D) meshes as well as one dimensional (1D) structures articulated by bends and T-shaped features. In the present invention, transition edge sensor (TES) devices were fabricated on a beam-isolated 110 mm×140 mm membrane.

More specifically, phononic filters were created by etching quasi-periodic nanoscale structures into supporting thermo-mechanical beams. The cross-sectional dimensions of the etched features are less than the thermal wavelength at the operating temperature, enabling coherent phonon transport to take place in one dimension. The phonon stop-band can be tuned by adjusting the scale of the quasi-periodic structures. Cascading multiple filter stages can increase bandwidth and provide improved thermal (phononic) isolation similar to the function of a multi-stage electrical filter.

In one embodiment, a detector according to the present invention, includes: a frame containing a dielectric membrane thereon; a silicon handle wafer which supports the membrane; a superconductor material disposed on the membrane; wherein a phononic crystal pattern having holes is etched in the membrane; and wherein a phonon bandgap centered at 2A restricts an escape of recombination and athermal phonons from the superconducting material.

In one embodiment, phononic filters are created by etching quasi-periodic nanoscale structures into said membrane, and a phonon stop-band is tuned by adjusting a scale of the quasi-periodic nanoscale structures to the frame.

In one embodiment, the dielectric membrane is at least one of silicon nitride or single-crystal silicon.

In one embodiment, a cross-sectional dimension of the etched features is less than a thermal wavelength at an operating temperature, enabling coherent phonon transport to take place.

In one embodiment, a length of the membrane and phononic crystal combined is less than a phonon mean-free-path.

In one embodiment, the membrane is patterned into a phononic crystal using electron-beam lithography or focused ion-beam milling.

In one embodiment, a center of the phonon bandgap includes frequencies of <30 GHz, and wherein the superconducting material with a $T_c$<400 mK is operated at 50 mK to suppress thermally generated quasiparticles.

In one embodiment, the superconductor material is one of titanium (Ti), hafnium (Hf), or aluminum manganese (AlMn).

In one embodiment, when the phonon bandgap is matched to a phonon pair-breaking frequency of the superconductor material at 2Δ, a quasiparticle lifetime is increased.

In one embodiment, the increase in quasiparticle lifetime is calculated as a function of the center $\Omega_{bg}$ of the phonon bandgap with a bandgap bandwidth $B_{bg}$ fixed to 0.3Δ, and wherein an increase in quasiparticle recombination time at 2Δ reflects a peak in quasiparticle density of states near Δ and peak phonon power flow near 2Δ due to recombination.

In one embodiment, a peak of phonon distribution due to recombination (including an exponential decrease thereafter) is captured as $\chi$ reaches a maximum when $\Omega_{bg}$ is at 2Δ.

In one embodiment, the phononic bandgap which restricts the escape of the recombination phonons from the superconductor material increases a quasiparticle recombination lifetime by more than an order of magnitude.

In one embodiment, the increase in the quasiparticle recombination lifetime using nonequilibrium particle distributions in a small-signal limit is in quantitative agreement with an equilibrium formulation.

In one embodiment, the quasiparticle recombination lifetime is obtained by one of measuring a generation-recombination noise or illuminating the superconducting material with phonon pair-breaking light.

In one embodiment, the detector is a kinetic inductance detector (MKID) or transition edge sensor (TES) bolometer.

In one embodiment, a superconducting microwave resonator is realized from a lumped capacitor and an inductor.

In one embodiment, the capacitor includes a superconductor with relatively high critical temperature $T_c$ of 9° K which confines the quasiparticles to an inductor metal with a relatively lower $T_c$; and the superconducting capacitor material is niobium (Nb) or niobium-titanium-nitride (Nb-TiN).

In one embodiment, a center of the phonon bandgap includes frequencies of >30 GHz. and the superconducting material with a $T_c$>400 mK, is operated at ~$T_c$/10 mK to suppress thermally generated quasiparticles.

In one embodiment, the phononic crystal pattern reduces an escape of recombination and athermal phonons from the superconductor material through geometric reduction in membrane cross-sectional area, to increase detector sensitivity.

In one embodiment, the superconducting material is aluminum.

In one embodiment, the detector is a single-photon calorimetry device.

In one embodiment, a method of manufacturing a detector, includes: providing a frame containing a dielectric membrane thereon; disposing a superconductor on the membrane; providing a silicon handle wafer to support the membrane; etching a phononic crystal pattern in the membrane; wherein a phonon bandgap centered at 2Δ restricts an escape of recombination and athermal phonons from the superconductor.

Thus, has been outlined, some features consistent with the present invention in order that the detailed description thereof that follows may be better understood, and in order that the present contribution to the art may be better appreciated. There are, of course, additional features consistent with the present invention that will be described below, and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for designing other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The description of the drawings includes exemplary embodiments of the disclosure and are not to be considered as limiting in scope.

The FIGURE depicts a schematic diagram of a phononic-isolated superconducting thin-film with adjacent membrane, and the corresponding electrothermal configuration, according to one embodiment consistent with the present invention.

DESCRIPTION OF THE INVENTION

The present invention relates to a phononic-isolated Kinetic Inductance Detector (KID) and a method of manufacturing thereof. The KID is a highly sensitive superconducting cryogenic detector which can be scaled to very large format arrays. The fabrication process of the KID of the present invention integrates a phononic crystal into a KID architecture. The phononic structures are designed to reduce the loss of athermal phonons, resulting in lower noise and higher sensitivity detectors. This fabrication process increases the quasiparticle lifetime, thus, reducing the noise equivalent power (NEP) without sacrificing the scalability.

It is anticipated that a photon noise limited sub-mm/far-IR cold telescope in space will require detectors with noise equivalent power (NEP) less than $1\times10^{-19}$ W/Hz$^{1/2}$ for imaging applications and at least an order of magnitude lower for spectroscopic studies. The detector NEP can be reduced by lowering the operation temperature and improving the thermal isolation between the bolometer and a heat bath. The present invention should achieve this feature by fabricating a membrane isolated transition edge sensor (TES) bolometer incorporating compact (<50 μm) thermal isolation beams based on phononic filters.

Since phonons can propagate coherently through a solid medium at temperatures below ~200 mK, the inventors of the present invention utilized this attribute to design structures such that there is a phononic bandgap that blocks modes of heat flow through the beams. In particular, when quasiparticles in a Bardeen-Cooper-Schrieffer (BCS) superconductor recombine into Cooper pairs, phonons are emitted within a narrow band of energies above the pairing energy at 2Δ. The present inventors discovered that a phonon bandgap restricting the escape of recombination phonons from a superconductor can increase the quasiparticle recombination lifetime by more than an order of magnitude. A phonon bandgap can be realized and matched to the recombination energy with a phononic crystal—i.e., a periodically patterned dielectric membrane.

The present inventors discovered that a nonequilibrium quasiparticle and phonon distribution arises in a superconductor due to a phonon bandgap and a pair-breaking phonon signal. Although intrinsically a nonequilibrium effect, the present inventors found that the lifetime enhancement in the small-signal regime is remarkably similar to an estimate from an equilibrium formulation. The equilibrium estimate closely follows $\exp(\Omega_{bg}/k_B T_b)$, where $\Omega_{bg}$ is the phonon bandgap energy bandwidth above $2\Delta$ and $T_b$ is the phonon bath temperature of the coupled electron-phonon system. The inventors also found an impact of the phononic bandgap on the performance of a superconducting circuit element and designed a microwave resonator to measure the enhancement in the quasiparticle lifetime. The details of the structure and function of the phononic-isolated Kinetic Inductance Detector (KID) of the present invention follow.

It is noted that the elastic properties of a nanopatterned dielectric, which is generally referred to as a phononic crystal (PnC), can be significantly different from the bulk material. In particular, a PnC infinite in extent, can possess a complete phonon bandgap, a property that can control phonon interactions and reduce heat transport at room temperature and in cryogenic devices. A PnC bandgap has been demonstrated to reduce the energy loss of a mechanical resonator to a phonon bath.

Generally speaking, electron-phonon coupling is intrinsic to superconductivity. When two quasiparticles recombine to form a Cooper pair in a superconductor, a phonon is emitted at the pairing energy $2\Delta$. A recombination phonon can either remain in the superconducting film 100 and break another pair or escape to the dielectric substrate (see the FIGURE). The FIGURE shows a schematic of a phononic-isolated superconducting thin-film 100 (i.e., hafnium (Hf) material or other superconductor material) with adjacent membrane 103 (i.e., silicon nitride ($SiN_x$) thin film which acts as the structural material for the KID detector), and the corresponding electrothermal configuration, according to one embodiment consistent with the present invention. The phononic crystal pattern of circular holes 101 etched in a square tiling 102 is shown in the present embodiment. The tiling 102 is etched in a membrane, which is deposited on a silicon handle wafer 104.

In the present invention, the phononic crystal unit-cell geometry and tiling 102 can be modified to suit the desired application. Typical dimensions of the embodiment of the present invention are shown for a superconducting thin film 100 realized as the inductor element of a superconducting microwave resonator. In one embodiment, the distance between beams of silicon wafer 104 is <10 μm, and the membrane width is <5 μm. In one embodiment, the cross-sectional dimensions of the etched features are less than the thermal wavelength at the operating temperature, enabling coherent phonon transport to take place in one dimension (1D).

In the present invention, the phonon stop-band can be tuned by adjusting the scale of the quasi-periodic structures. Cascading multiple filter stages can increase bandwidth and provide improved thermal isolation similar to the function of a multi-stage electrical filter.

As shown in the FIGURE, $P_s$ is a pair-breaking photon signal power. In the embodiment shown in the FIGURE, the bath temperature $T_b$ is set to $0.1 T_c$, where $T_c$ is the critical temperature of the superconducting film. The phonon pair-breaking and escape rates together with the electron-phonon coupling strength, as shown in the FIGURE, determine the quasiparticle lifetime $\tau_{qp}$ in the superconductor. A PnC bandgap centered at $2\Delta$ should substantially reduce the escape rate of recombination phonons from the superconductor and increase $\tau_{qp}$.

It is noted that the quasiparticle recombination lifetime plays an important role in noise processes of pair-breaking superconducting devices. Ina kinetic inductance detector (KID), the fundamental limiting noise in the steady state is from the generation and recombination (GR) of quasiparticles. The noise-equivalent power (NEP) (noise power detected in a 1-Hz bandwidth) due to GR fluctuations is proportional to $\sqrt{1/\tau_{qp}}$. Independent of the fluctuation mechanism limiting the sensitivity of a Cooper-pair breaking device, a reduction in the recombination phonon escape rate would lead to an increase in the responsivity of a superconducting thin film to pair-breaking photons. By symmetry of the phonon transport across a PnC (a passive linear system), a superconducting circuit can be an effective shield against quasiparticle poisoning induced by pair-breaking phonons that originate in the frame 102 of the device and are injected into a superconductor.

In one embodiment of the present invention, a superconducting resonator fabricated on a thin (<1 μm) self-supporting dielectric membrane has been implemented for increasing $\tau_{qp}$. The membrane dimension is significantly larger than the phonon mean-free-path (<100 μm). Thus, phonons in the membrane are weakly coupled to the thermal bath, and the phonon lifetime is increased at all energies. Additionally, the quasiparticle and phonon occupations in the superconducting film 100 approach a thermal distribution with an effective temperature corresponding to the signal power, and $\tau_{qp}$ approaches the thermal response time of $\tau_{th}=C/G$, where C is the total heat capacity from the quasiparticles and phonons and G is the thermal conductance to the bath. Hence, such a membrane-isolated superconducting resonator of the present invention functions as a bolometer.

In the present invention, the inventors examined the electron-phonon system of a superconducting thin film surrounded by a PnC, as shown in the FIGURE. When the phonon bandgap of the PnC is matched to the pair-breaking frequency of the superconductor at ~$2\Delta$, the quasiparticle lifetime becomes a strong function of the bandgap properties. The PnC only increases the lifetime of the membrane phonons with energies within the bandgap. Above and below the bandgap energies, the phonon transmission to the bath often rapidly approaches unity. In one embodiment of the present invention, the length of the membrane and PnC combined is less than the phonon mean-free-path, and consequently thermal phonons (<10 GHz) in the membrane 103 supporting the superconducting film 100 remain tightly coupled to the bath. The quasiparticle and phonon distributions in the system will be out of equilibrium since the thermal phonon escape rate is comparable to or greater than the pair-breaking rate.

In the present invention, to estimate the quasiparticle lifetime enhancement due to a PnC bandgap, the inventors solved the coupled kinetic equations of the electron-phonon system in the FIGURE. Their solution takes into account electron-phonon scattering in the superconductor 100, pair-breaking due to phonons and incident signal photons, and phonon transport as modified by a PnC bandgap. The rate equations for the quasiparticle and phonon energy distributions, the effect of the phonon bandgap, the superconductor configuration and material parameters, steady-state solutions, and quasiparticle lifetime enhancement at non-equilibrium and with an equilibrium approximation, are disclosed in detail in "*Enhanced quasiparticle lifetime in a superconductor by selective blocking of recombination phonons with a phononic crystal*", by R. Rostem, P. J. de Visser, and E. J. Wollack, published in *Physical Review* B 98, 014552 (2018), the contents of which are herein incorporated by reference in their entirety.

In the results of their simulations, the present inventors were able to show that more than an order of magnitude increase in the quasiparticle lifetime is possible with a phonon bandgap that can be practically achieved with a PnC. The nonequilibrium calculation of the electron-phonon model of the present invention, as shown in the FIGURE showed a decrease in $\chi$ (the quasiparticle lifetime enhancement parameter) with increasing photon pair-breaking power, an effect that is largely attributed to an increase in the phonon flow to the bath at all energies and a redistribution of the quasiparticle energies through electron-phonon scattering.

The inventors found that when the quasi particle injection rate due to pair-breaking signal photons $\Gamma_s$ is much less than the distribution-averaged pair-breaking rate $\Gamma_{pb}$ (small-signal limit), the equilibrium approximation to the quasiparticle recombination time agrees remarkably well with a calculation using the full nonequilibrium solutions of the kinetic equations. The enhancement in $\tau_{qp}$ calculated from the equilibrium approximation closely follows an exponential function with the bandgap bandwidth $B_{bg}$, i.e., $\chi$ about equal to $\exp(B_{bg}/k_B T_b)$, where $k_B$ is Boltzman's constant, and $T_b$ is the bath temperature, an effect that arises from the form of the Fermi-Dirac and Bose-Einstein distributions for the quasiparticle and phonon occupations, respectively.

For the same reason, the effect of a phonon bandgap depends strongly on bath temperature and the density of thermally generated quasiparticles. The inventors found that the estimate of the quasiparticle enhancement from the equilibrium approximation calculation will not reach an asymptote as a function of bandgap bandwidth because the phonon bandgap as introduced in the recombination calculation prevents electron-phonon scattering from taking place inside the superconductor at the bandgap energies.

The present inventors found that the quasiparticle recombination time enhancement in the small-signal limit is a function of the bandgap position. They found that when the enhancement in the quasiparticle lifetime is calculated as a function of the bandgap center $\Omega_{bg}$ with the bandgap bandwidth $B_{bg}$ fixed to 0.3$\Delta$, the sharp increase in the recombination time at 2$\Delta$ reflects the peak in the quasiparticle density of states near $\Delta$ and peak phonon power flow near 2$\Delta$ due to recombination. Further, capturing the peak of the phonon distribution due recombination (including the exponential decrease thereafter) is important as $\chi$ reaches a maximum when $\Omega_{bg}$ is at ~2.1$\Delta$.

The inventors also considered how $\chi$ scales with $r_{bg}$. An ideal PnC infinite in extent can be designed to form a complete phonon bandgap in which case $r_{bg}$ is infinite. However, practical constraints in a superconducting circuit will pose a limitation on the PnC size. A truncation in the size of the PnC leads to a bandgap, the rejection level of which depends on the crystal dimensions. The rejection level is typically $10^3$ with three-unit cells and greater than $10^6$ with six-unit cells or more. The enhancement in the quasiparticle recombination lifetime reveals that when $\chi$ reaches an asymptote with $r_{bg}$, it reflects the finite number of ~2$\Delta$ phonons in the superconductor that are prevented from flowing to the thermal bath due to the PnC bandgap.

With the above results, the inventors experimentally addressed the quasiparticle lifetime enhancement due to a PnC bandgap, by designing the superconducting microwave resonator of the present invention, realized as a lumped-element or a distributed transmission line circuit. In one embodiment, the resonator was realized from a lumped capacitor and inductor. Alternatively, a distributed transmission line resonator can be utilized for this purpose.

In one embodiment, the PnC is patterned around the inductor, which is the only element sensitive to the quasiparticle dynamics. The inductor linewidth was set at typically 1 to 2 µm with a total required membrane size of 30 µm, which is smaller than the thermal phonon mean-free-path. The quasiparticle recombination time may be probed by either measuring the generation-recombination noise or illuminating the inductor with pair-breaking light. The capacitive element of the resonator may be realized with a high-$T_c$ (>9 K) superconductor (e.g., niobium (Nb) or niobium-titanium-nitride (NbTiN)), which confines the quasiparticles to the inductor metal with a much lower $T_c$.

In one embodiment, the PnC may be realized in a thin dielectric membrane (~100 nm). Current fabrication technologies, such as electron-beam lithography and focused ion-beam milling can be used to pattern the membrane into a PnC. In one embodiment, a minimum unit cell was achieved at ~70 nm, but this is dependent on fabrication techniques, and this size can be reduced further. Only a few unit cells are needed to realize a greater than 104 suppression of the phonon flux to the bath at the bandgap energies of the PnC.

As noted above, the FIGURE illustrates a typical configuration of the present invention. In one embodiment, the minimum unit cell limits the center of the bandgap to frequencies of <30 GHz, which requires a superconductor with a $T_c$<400 mK (e.g., titanium (Ti), hafnium (Hf), and aluminum manganese (AlMn)), that is operated at around 50 mK to suppress thermally generated quasiparticles.

In another embodiment, the superconductor can include those with a $T_c$>400 mK, such as aluminum (Al), where the phononic crystal bandgap is matched to 2$\Delta$, and where the phononic crystal reduces the escape of recombination and athermal phonons from the superconductor through geometric reduction in membrane cross-sectional area, which increases detector sensitivity. This shows that a bandgap is not necessary for the phononic crystal to function as a filter. Thus, a center of said phonon bandgap includes frequencies of >30 GHz, and wherein said superconducting material with a $T_c$>400 mK, is operated at ~$T_c$/10 mK to suppress thermally generated quasiparticles.

The inventors also considered the sensitivity of the quasiparticle recombination time to a phonon bandgap for measuring the spectral response of PnCs using a superconducting microwave resonator. Although there are well-established methods for measuring the elastic properties of PnCs, such as Brillouin scattering, coupling a superconducting resonator to a PnC can be used to explore the electron-phonon coupling in a superconducting film deposited on an elastic dielectric membrane and operated at sub-Kelvin temperatures. The electromechanical system of the FIGURE of the present invention would be particularly sensitive to phonon dimensionality and phonon density of states in each film through the electron-phonon interaction function $\alpha^2(\Omega) \rho_\varphi(\Omega)$. Further, the inventors found that the electron-phonon coupling in superconducting microwave resonators push the performance limit of current ultrasensitive microwave kinetic-inductance detectors (KIDs), as further discussed below.

Thus, the inventors have found that a phonon bandgap restricting the escape rate of recombination phonons from a superconducting film has a strong effect on the quasiparticle dynamics. In the present invention, the quasiparticle lifetime $\tau_{qp}$ is increased by more than an order of magnitude for realistic bandgap properties that can be achieved with phononic crystals. When the pair-breaking photon rate is low, the enhancement in the quasiparticle lifetime calculated using nonequilibrium particle distributions is in good quantitative agreement with an equilibrium formulation. The enhancement in $\tau_{qp}$ should have a significant impact in superconducting devices where quasiparticle fluctuation plays an important role in limiting the sensitivity and responsivity to pair-breaking photons. In addition, $\tau_{qp}$ is sensitive to the position of the phonon bandgap. This response provides a useful probe for phonon coupling in low-dimensional thin films. By symmetry of the phonon transport across a PnC, an isolated superconductor of the present invention will be less susceptible to pair-breaking phonon-mediated quasiparticle poisoning.

In the present invention, a variety of phononic device geometries have been fabricated including two dimensional (2D) meshes as well as one dimensional (1D) structures articulated by bends and T-shaped features. In the present invention, transition edge sensor (TES) devices were fabricated on a beam-isolated 110 mm×140 mm membrane.

More specifically, phononic filters were created by etching quasi-periodic nanoscale structures into supporting thermo-mechanical beams. The cross-sectional dimensions of the etched features are less than the thermal wavelength at the operating temperature, enabling coherent phonon transport to take place in one dimension. The phonon stop-band can be tuned by adjusting the scale of the quasi-periodic structures. Cascading multiple filter stages can increase bandwidth and provide improved thermal (phononic) isolation similar to the function of a multi-stage electrical filter.

The present invention would have benefit in any commercial application that requires very high-performance cryogenic detectors. The process could potentially enable single photon calorimetry in ultraviolet (UV) to infrared (IR) applications.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A detector, the detector comprising:
   a frame containing a dielectric membrane thereon;
   a silicon handle wafer which supports said membrane; and
   a superconductor material disposed on said membrane,
   wherein a phononic crystal pattern having holes is etched in said membrane; and
   wherein a phonon bandgap centered at 2Δ restricts an escape of recombination and athermal phonons from said superconducting material.

2. The detector of claim 1, wherein phononic filters are created by etching quasi-periodic nanoscale structures into said membrane, and a phonon stop-band is tuned by adjusting a scale of said quasi-periodic nanoscale structures to said frame.

3. The detector of claim 2, wherein said dielectric membrane is at least one of silicon nitride or single-crystal silicon.

4. The detector of claim 3, wherein a cross-sectional dimension of said etched features is less than a thermal wavelength at an operating temperature, enabling coherent phonon transport to take place.

5. The detector of claim 4, wherein a length of said membrane and phononic crystal combined is less than a phonon mean-free-path.

6. The detector of claim 5, wherein said membrane is patterned into a phononic crystal using electron-beam lithography or focused ion-beam milling.

7. The detector of claim 6, wherein a center of said phonon bandgap includes frequencies of <30 GHz, and wherein said superconducting material with a $T_c$<400 mK is operated at 50 mK to suppress thermally generated quasiparticles.

8. The detector of claim 7, wherein said superconductor material is one of titanium (Ti), hafnium (Hf), or aluminum manganese (AlMn).

9. The detector of claim 8, wherein when said phonon bandgap is matched to a phonon pair-breaking frequency of said superconductor material at 2Δ, a quasiparticle lifetime is increased.

10. The detector of claim 9, wherein said increase in quasiparticle lifetime is calculated as a function of said center $\Omega_{bg}$ of said phonon bandgap with a bandgap bandwidth $B_{bg}$ fixed to 0.3Δ, and
    wherein an increase in quasiparticle recombination time at 2Δ reflects a peak in quasiparticle density of states near Δ and peak phonon power flow near 2Δ due to recombination.

11. The detector of claim 10, wherein a peak of phonon distribution due recombination, is captured as $\chi$ reaches a maximum when $\Omega_{bg}$ is at 2Δ.

12. The detector of claim 11, wherein said phononic bandgap which restricts said escape of said recombination phonons from said superconductor material increases a quasiparticle recombination lifetime by more than an order of magnitude.

13. The detector of claim 12, wherein said increase in said quasiparticle recombination lifetime using nonequilibrium particle distributions in a small-signal limit is in quantitative agreement with an equilibrium formulation.

14. The detector of claim 13, wherein said quasiparticle recombination lifetime is obtained by one of measuring a generation-recombination noise or illuminating said superconducting material with phonon pair-breaking light.

15. The detector of claim 1, wherein the detector is a kinetic inductance detector (MKID) or transition edge sensor (TES) bolometer.

16. The detector of claim 1, wherein a superconducting microwave resonator is realized from a lumped capacitor and an inductor.

17. The detector of claim 16, wherein said capacitor includes a superconductor with relatively higher critical temperature $T_c$ of 9° K which confines said quasiparticles to an inductor metal with a relatively lower $T_c$; and
    wherein said superconducting capacitor material is niobium (Nb) or niobium-titanium-nitride (NbTiN).

18. The detector of claim 6, wherein a center of said phonon bandgap includes frequencies of >30 GHz, and wherein said superconducting material with a $T_c$>400 mK, is operated at ~$T_c$/10 mK to suppress thermally generated quasiparticles.

19. The detector of claim 18, wherein said phononic crystal pattern reduces an escape of recombination and athermal phonons from said superconductor material through geometric reduction in membrane cross-sectional area, to increase detector sensitivity.

20. The detector of claim 19, wherein said superconducting material is aluminum.

21. A single-photon calorimetry device including the detector of claim 1.

22. A method of manufacturing a detector, the method comprising:
   providing a frame containing a dielectric membrane thereon;
   disposing a superconductor on said membrane;
   providing a silicon handle wafer to support said membrane;
   etching a phononic crystal pattern of holes in said membrane;
   wherein a phonon bandgap centered at $2\Delta$ restricts an escape of recombination and athermal phonons from said superconductor.

* * * * *